(12) United States Patent
Lee et al.

(10) Patent No.: US 10,939,547 B2
(45) Date of Patent: Mar. 2, 2021

(54) DISPLAY DEVICE AND METHOD OF MANUFACTURING THE SAME

(71) Applicant: Samsung Display Co., Ltd., Yongin-si (KR)

(72) Inventors: Ah-Ram Lee, Cheonan-si (KR); Seong Sik Ahn, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 281 days.

(21) Appl. No.: 16/163,944

(22) Filed: Oct. 18, 2018

(65) Prior Publication Data

US 2019/0269011 A1    Aug. 29, 2019

(30) Foreign Application Priority Data

Feb. 23, 2018    (KR) .................. 10-2018-0022247

(51) Int. Cl.
*H05K 7/00*    (2006.01)
*H05K 1/03*    (2006.01)
*H05K 3/00*    (2006.01)

(52) U.S. Cl.
CPC ......... *H05K 1/0313* (2013.01); *H05K 3/0014* (2013.01); *H05K 2201/10128* (2013.01); *H05K 2203/107* (2013.01); *H05K 2203/11* (2013.01); *H05K 2203/302* (2013.01)

(58) Field of Classification Search
CPC ............. H05K 1/0313; H05K 3/0014; H05K 2201/10128; H05K 2203/107; H05K 2203/11; H05K 2203/302

USPC .................................. 361/748, 749
See application file for complete search history.

(56) References Cited

U.S. PATENT DOCUMENTS

| | | | |
|---|---|---|---|
| 9,746,884 B2 | 8/2017 | Lee et al. | |
| 10,600,988 B2 * | 3/2020 | Choi | ............ B32B 3/26 |
| 2015/0015513 A1 * | 1/2015 | Kwak | ............ G06F 1/1637 |
| | | | 345/173 |
| 2015/0138041 A1 * | 5/2015 | Hirakata | ............ H01L 27/323 |
| | | | 345/1.3 |
| 2017/0173634 A1 | 6/2017 | Hashimoto et al. | |
| 2017/0301742 A1 | 10/2017 | Jeong et al. | |

FOREIGN PATENT DOCUMENTS

KR    10-2017-0085344 A    7/2017
KR    10-2017-0131806 A    11/2017

* cited by examiner

*Primary Examiner* — Binh B Tran
(74) *Attorney, Agent, or Firm* — Kile Park Reed & Houtteman PLLC (57) ABSTRACT

A display device includes a substrate having a flat portion, a first curved portion adjacent to a side of the flat portion, and a second curved portion adjacent to a corner of the flat portion and the first curved portion, and a display unit on the substrate, the display unit including a plurality of display pieces on the second curved portion of the substrate, the display pieces being spaced apart from each other, and extending from the corner of the flat portion to an edge of the second curved portion.

20 Claims, 10 Drawing Sheets

DISPLAY DEVICE AND METHOD OF MANUFACTURING THE SAME

CROSS-REFERENCE TO RELATED APPLICATION

Korean Patent Application No. 10-2018-0022247, filed on Feb. 23, 2018 in the Korean Intellectual Property Office (KIPO), and entitled: "Display Device and Method of Manufacturing the Same," is incorporated by reference herein in its entirety.

BACKGROUND

1. Field

Embodiments relate to a display device. Embodiments further relate to a display device of which edge is curved, and a method of manufacturing the display device.

2. Description of the Related Art

Recently, display devices having various shapes such as flexible display devices whose shape may be freely modified, bendable display devices whose bent shape may be maintained, or the like, have been studied to accommodate demands for various designs.

SUMMARY

Embodiments are directed to a display device including a substrate having a flat portion, a first curved portion adjacent to a side of the flat portion, and a second curved portion adjacent to a corner of the flat portion and the first curved portion, and a display unit on the substrate, the display unit including a plurality of display pieces on the second curved portion of the substrate, the display pieces being spaced apart from each other, and extending from the corner of the flat portion to an edge of the second curved portion.

The substrate may include a contractible polymer.

The second curved portion of the substrate may include a plurality of contractible portions located at regions corresponding to spaces between the plurality of display pieces of the display unit.

The plurality of contractible portions may be contractible upon exposure to laser light.

Each of the plurality of contractible portions may have a fan shape in a plan view.

The second curved portion may further includes a plurality of non-contractible portions located at regions corresponding to the plurality of display pieces. A thickness of each of the plurality of contractible portions may be greater than a thickness of each of the plurality of non-contractible portions.

The second curved portion of the substrate may include a plurality of substrate pieces located at regions corresponding to the plurality of display pieces and a plurality of openings defined between the plurality of the substrate pieces.

The plurality of substrate pieces may be bondable to each other upon exposure to laser light.

Each of the plurality of openings have a fan shape in a plan view.

The substrate may include a first substrate layer and a second substrate layer located between the first substrate layer and the display unit. The second curved portion of the first substrate layer may include a plurality of openings located at regions corresponding to spaces between the plurality of display pieces of the display unit.

The display unit may be located on the flat portion, the first curved portion, and the second curved portion of the substrate.

The display device may further include a cover window on the display unit. A portion of the cover window corresponding to the first curved portion and the second curved portion of the substrate may be curved.

Embodiments are also directed to a method of manufacturing a display device, including preparing a substrate having a flat portion, a first bendable portion adjacent to a side of the flat portion, and a second bendable portion adjacent to a corner of the flat portion and the first bendable portion, forming a display unit on the substrate, wherein the display unit includes a plurality of display pieces disposed on the second bendable portion of the substrate, spaced apart from each other and extending from the corner of the flat portion to an edge of the second bendable portion, and bending the first bendable portion and the second bendable portion of the substrate.

The substrate may include a contractible polymer.

The second bendable portion of the substrate may include a plurality of contractible portions located at regions corresponding to spaces between the plurality of display pieces of the display unit. Bending the first bendable portion and the second bendable portion may include contracting the plurality of contractible portions.

The plurality of contractible portions may be contracted by exposing the contractible portions to laser light.

Preparing the substrate may include forming a plurality of openings in the second bendable portion of the substrate, the plurality of openings corresponding to spaces between the plurality of display pieces of the display unit.

The second bendable portion of the substrate may include a plurality of substrate pieces spaced apart from each other by the plurality of openings. Bending the first bendable portion and the second bendable portion may include bonding the plurality of substrate pieces to each other.

The plurality of substrate pieces may be bonded to each other by exposing the substrate pieces to laser light.

Bending the first bendable portion and the second bendable portion may include combining the substrate and a cover window with the display unit in between, wherein a portion of the cover window corresponding to the first bendable portion and the second bendable portion of the substrate is curved.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Figure 1:
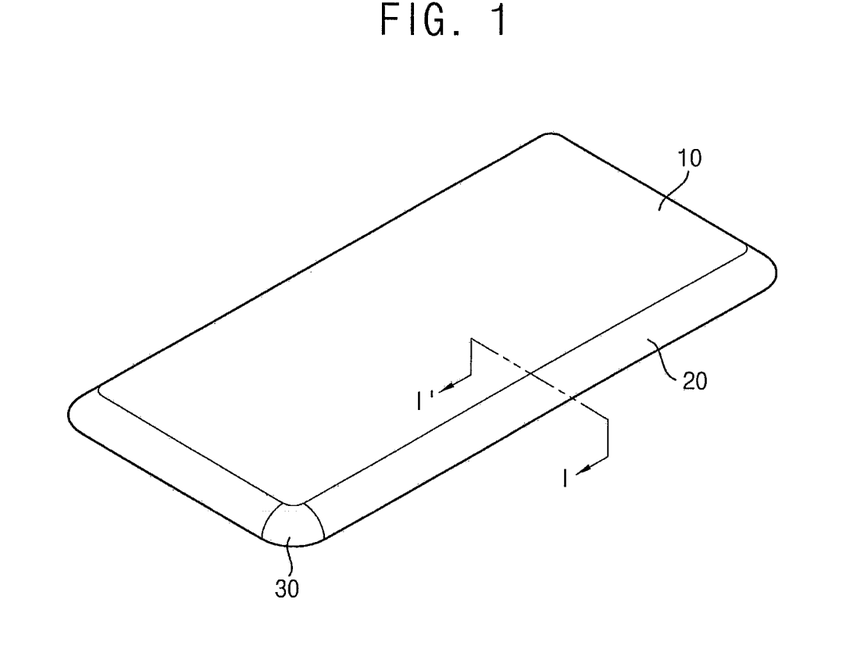
FIG. 1 illustrates a perspective view of a display device according to embodiments.
Figure 2:
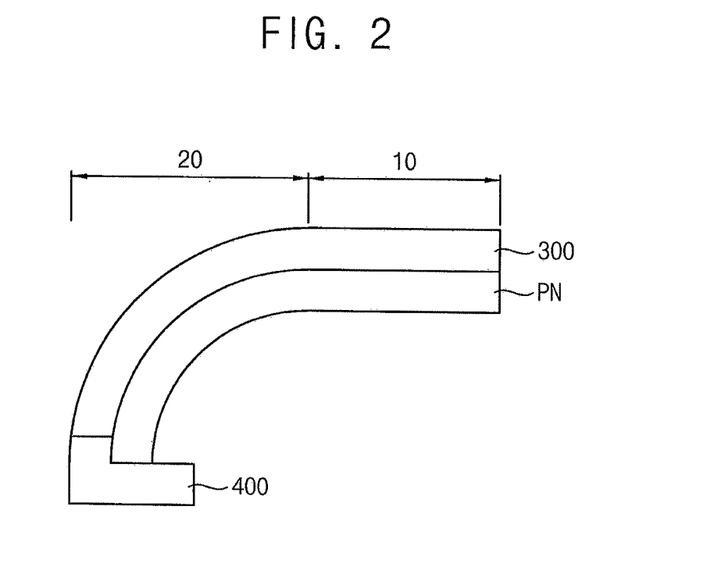
FIG. 2 illustrates a cross-sectional view of the display device in FIG. 1.

FIG. 1 illustrates a perspective view pf a display device according to embodiments. FIG. 2 illustrates a cross-sectional view of the display device in FIG. 1. FIG. 2 is a cross-sectional view of the display device in FIG. 1 taken along a line I-I'

Referring to FIGS. 1 and 2, a display device according to embodiments may include a display panel PN, a cover window 300, and a frame 400. At least a portion of an edge of the display device may be curved. For example, as illustrated in FIG. 1, an entirety of the edge of the display device may be curved in a front direction or a bottom direction. Accordingly, the display device may include a front portion 10 located on a front surface of the display device, a curved side portion 20 extended from the front portion 10 and located at a side of the front portion 10, and a curved corner portion 30 extended from the front portion 10 and located at a corner of the front portion 10.

The cover window 300 may be disposed on the display panel PN. The cover window 300 may protect the display panel PN from external impact, scratches, or the like. The display panel PN may emit light in a direction to the cover window 300 to display an image. As illustrated in FIG. 2, an edge of the display panel PN corresponding to the side portion 20 of the display device may be curved, and an edge of the cover window 300 may be curved corresponding to the edge of the display panel PN.

An adhesive layer may be disposed between the display panel PN and the cover window 300 thereby joining the display panel PN and the cover window 300. The adhesive layer may include, for example, an optically clear adhesive (OCA).

The frame 400 may be disposed at an end portion of the display panel PN and an end portion of the cover window 300. The frame 400 may surround the end portion of the display panel PN and the end portion of the cover window 300 and may support the display panel PN and the cover window 300.

Hereinafter, a display panel according to an embodiment will be described with reference to FIGS. 3, 4, 5, 6, 7, and 8.

Figure 3:
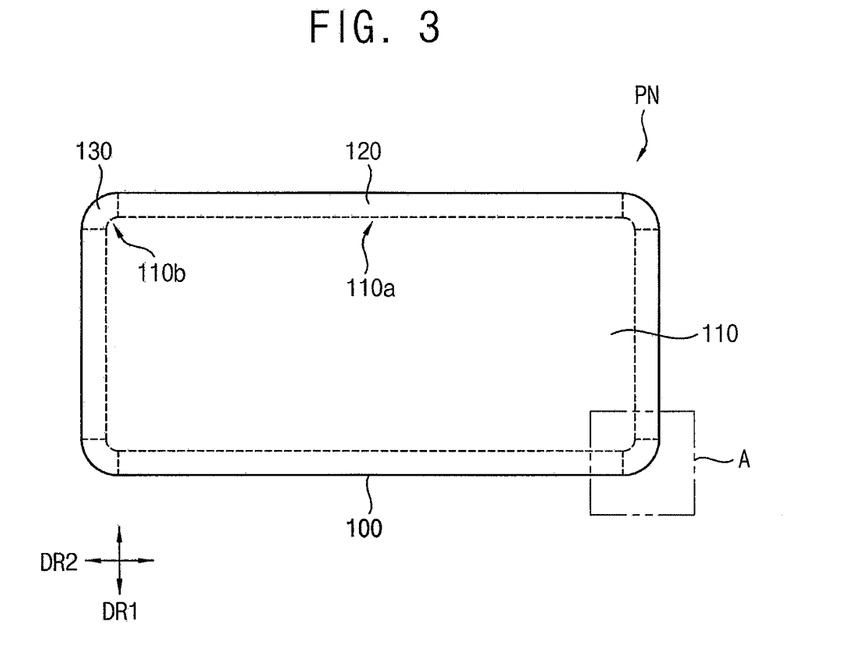
FIG. 3 illustrates a plan view of a display panel in an unbent state according to embodiments.
Figure 4:
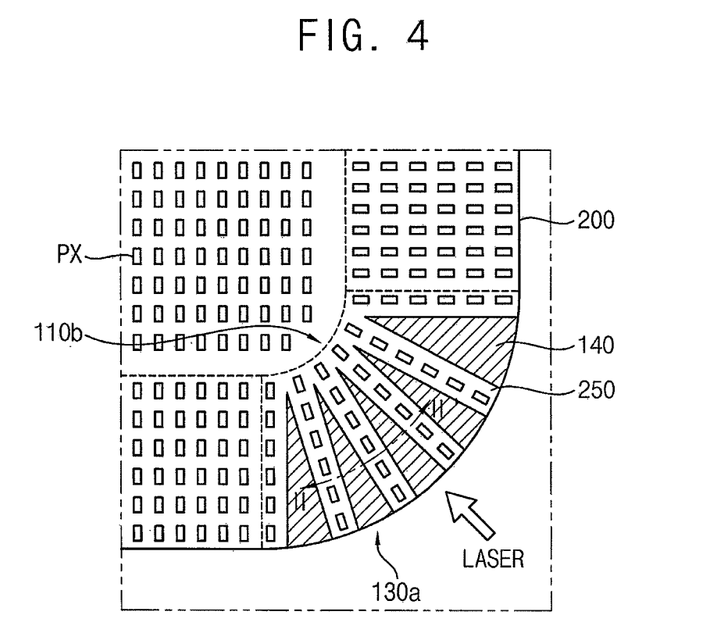
FIG. 4 illustrates a plan view of a display panel in an unbent state according to an embodiment.
Figure 5:
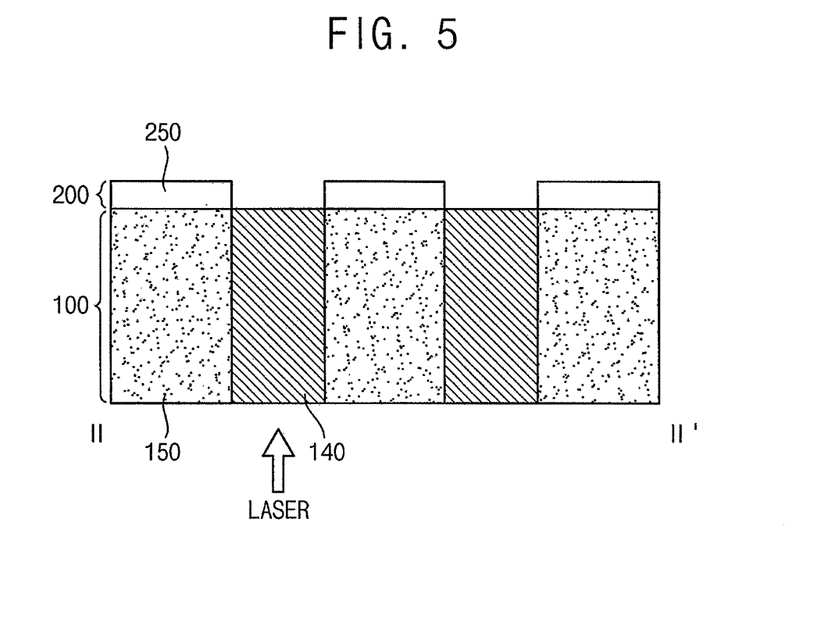
FIG. 5 illustrates a cross-sectional view of the display panel in FIG. 4.

FIG. 3 illustrates a plan view of a display panel in an unbent state according to embodiments. FIG. 4 illustrates a plan view of a display panel in an unbent state according to an embodiment. FIG. 5 illustrates a cross-sectional view of the display panel in FIG. 4. FIG. 4 illustrates a plan view enlargement of an area A of the display panel in FIG. 3. FIG. 5 illustrates a cross-sectional view of the display panel in FIG. 4 taken along a line II-II'.

Figure 6:
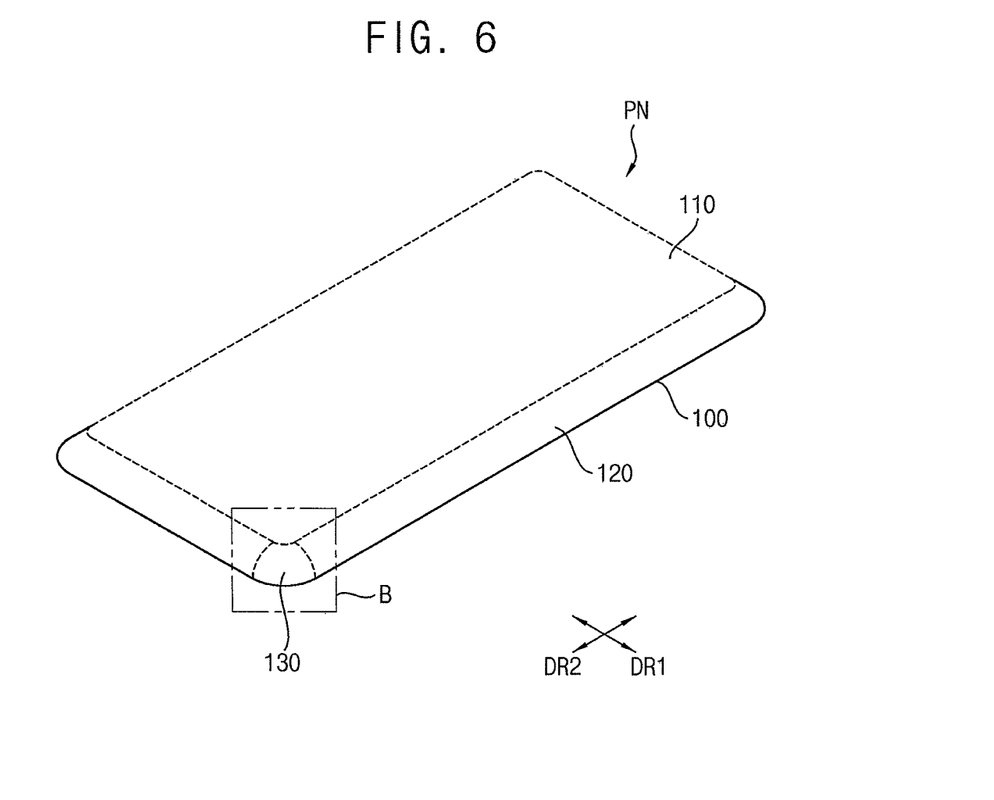
FIG. 6 illustrates a perspective view of a display panel in a bent state according to embodiments.
Figure 7:
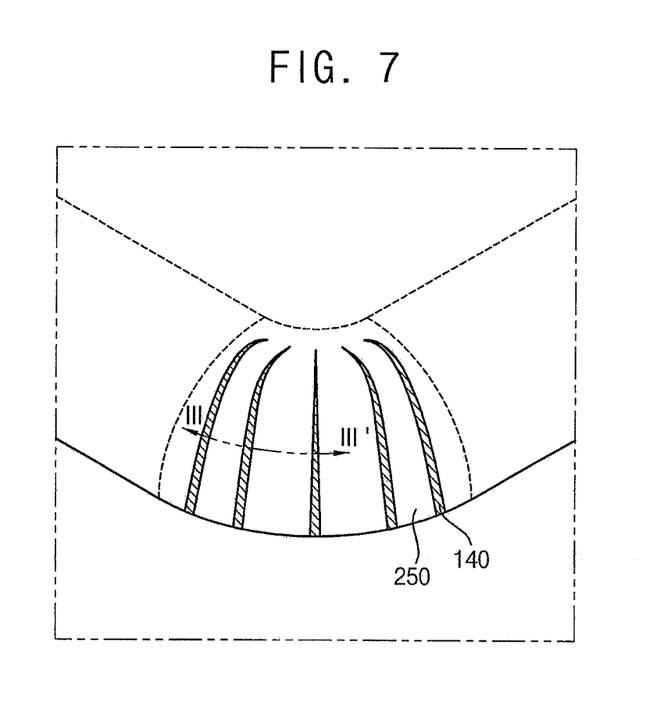
FIG. 7 illustrates a perspective view of a display panel in a bent state according to an embodiment.
Figure 8:
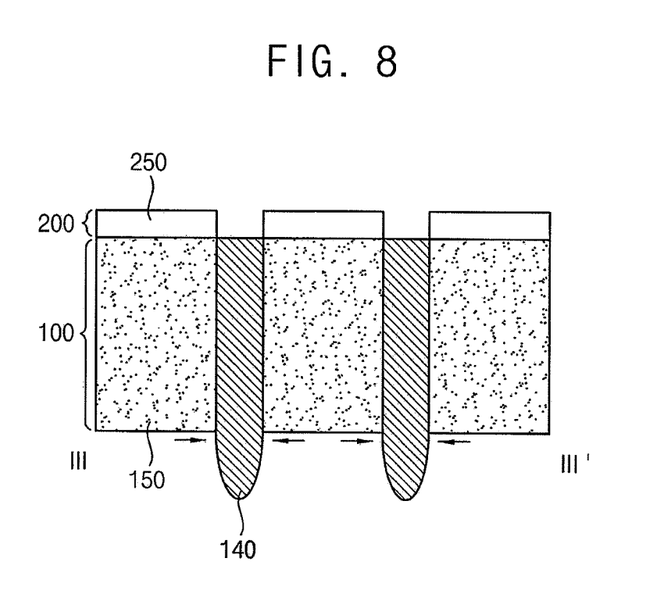
FIG. 8 illustrates a cross-sectional view of the display panel in FIG. 7.

FIG. 6 illustrates a perspective view of a display panel in a bent state according to embodiments. FIG. 7 illustrates a perspective view of a display panel in a bent state according to an embodiment. FIG. 8 illustrates a cross-sectional view of the display panel in FIG. 7. FIG. 7 illustrates a plan view enlargement of an area B of the display panel in FIG. 6. FIG. 8 illustrates a cross-sectional view of the display panel in FIG. 7 taken along a line III-III'.

Referring to FIGS. 3, 4, 5, 6, 7, and 8, the display panel PN according to an embodiment may include a substrate 100 and a display unit 200.

The substrate 100 may include a flat portion 110, a first curved portion 120, and a second curved portion 130. The substrate 100 may have a suitable planar shapes. For example, the substrate 100 may have rectangular planar shape with rounded corners as shown in FIG. 3.

The flat portion 110 may include at least one side 110a and at least one corner 110b. For example, when the flat portion 110 has a rectangular shape, the flat portion 110 may have four sides 110a and four corners 110b. The corner 110b of the flat portion 110 may have a suitable shape. For example, the corner 110b of the flat portion 110 may be rounded, as shown in FIG. 3.

When the display panel PN is bent, the flat portion 110 may not be bent. Accordingly, the flat portion 110 may have a planar shape.

The first curved portion 120 may be adjacent to the side 110a of the flat portion 110. For example, the substrate 100 may have four first curved portions 120 respectively adjacent to four sides 110a of the flat portion 110.

When the display panel PN is bent, the first curved portion 120 may be bent. The first curved portion 120 may have a two-dimensional curved shape. Herein, the term "two-dimensional curved shape" refers to a shape in which a flat surface is bent in one direction. For example, the first curved portion 120 may be bent in a first direction DR1 or a second direction DR2, which is a direction from the flat portion 110 to the first curved portion 120.

The second curved portion 130 may be adjacent to the corner 110b of the flat portion 110 and the first curved portion 120. The second curved portion 130 may be located between the first curved portions 120 perpendicular to each other. For example, the substrate 100 may have four second curved portions 130 respectively adjacent to four corners 110b of the flat portion 110.

When the display panel PN is bent, the second curved portion 130 may be bent. The second curved portion 130 may have a three-dimensional curved shape. Herein, the term "three-dimensional curved shape" refers to a shape in which a flat surface is bent in two or more directions. For example, the second curved portion 130 may be bent in a plurality of directions between the first direction DR1 and the second direction DR2 that are perpendicular to each other.

The display unit 200 may be disposed on the substrate 100. The display unit 200 may include a plurality of pixels PX. Each of the pixels PX may emit light. The display unit 200 may display an image formed by light emitted from the pixels PX.

In an embodiment, the display unit 200 may be disposed on the flat portion 110, the first curved portion 120, and the second curved portion 130 of the substrate 100. Accordingly, the pixels PX may be formed on the flat portion 110, the first curved portion 120, and the second curved portion 130 of the substrate 100. In this case, the display device may display an image from the curved side portion 20 and the curved corner portion 30 as well as the front portion 10. Therefore, a dead space of the display device may be reduced, and the display device may provide an improved aesthetic experience. In an embodiment, one main image may be integrally displayed at the front portion 10, the side portion 20, and the corner portion 30 of the display device. In an embodiment, a main image may be displayed at the front portion 10, and an auxiliary image may be displayed at the side portion 20 and the corner portion 30.

The display unit 200 may include a plurality of display pieces 250 disposed on the second curved portion 130 of the substrate 100. The display pieces 250 may be spaced apart from each other and may extend from the corner 110b of the flat portion 110 to an edge 130a of the second curved portion 130.

As illustrated in FIG. 4, when the second curved portion 130 is in an unbent state, first ends of the display pieces 250 may be in contact with each other, and second ends of the display pieces 250 may be spaced apart from each other. Each of the display pieces 250 may extend in a direction between the first direction DR1 and the second direction DR2. Openings each having a fan shape in a plan view may be formed between adjacent display pieces 250.

When the second curved portion 130 is bent, the second curved portion 130 may have a three-dimensional curved shape. A length of an arc that represents a length of the edge 130a of the second curved portion 130 may decrease. For example, a length of the edge 130a of the second curved portion 130 when the second curved portion 130 is bent may be less than a length of the edge 130a of the second curved portion 130 when the second curved portion 130 is in an unbent state. Accordingly, the display pieces 250 may be formed such that the second ends of the display pieces 250 are spaced apart from each other when the second curved portion 130 is in an unbent state.

As illustrated in FIG. 7, when the second curved portion 130 is bent, the second ends of the display pieces 250 may be in contact with each other or adjacent to each other. In this case, the openings between the adjacent display pieces 250 may disappear, or areas of the openings may decrease.

A number of the display pieces 250 may be calculated according to a curvature of the second curved portion 130. For example, the number of the display pieces 250 may be relatively small when the curvature of the second curved portion 130 is small, and the number of the display pieces 250 may be relatively large when the curvature of the second curved portion 130 is large.

In an embodiment, the substrate 100 may include a contractible polymer. For example, the substrate 100 may include a polymer that is contractible by exposing the polymer to laser light without providing heat.

The second curved portion 130 of the substrate 100 may include a plurality of contractible portions 140 and a plurality of non-contractible portions 150. The contractible portions 140 may be located at regions corresponding to spaces between the display pieces 250. The non-contractible portions 150 may be located at regions corresponding to the display pieces 250. For example, the contractible portions 140 may be located at regions corresponding to the openings between the adjacent display pieces 250. Accordingly, each of the contractible portions 140 may have a fan shape in a plan view.

A planar area of each of the contractible portions 140 may be calculated according to a curvature of the second curved portion 130. For example, the planar area of each of the contractible portions 140 may be relatively small when the curvature of the second curved portion 130 is small, and the planar area of each of the contractible portions 140 may be relatively large when the curvature of the second curved portion 130 is large.

In an embodiment, the contractible portions 140 may be contracted in response to a stimulus applied from outside. For example, the contractible portions 140 may be contracted by exposure to laser light. When the second curved portion 130 is bent, laser light may be irradiated onto the contractible portions 140, and the contractible portions 140 may contract. For example, when the contractible portions 140 are exposed to laser light, a width of each of the contractible portions 140 may decrease, and a thickness each of the contractible portions 140 may increase. Accordingly, when the second curved portion 130 is bent, a thickness of each of the contractible portions 140 may be greater than a thickness of each of the non-contractible portions 150.

As described above, the second curved portion 130 of the substrate 100 may be bent as a three-dimensional curved shape, therefore, the display unit 200 may include the display pieces 250 spaced apart from each other on the second curved portion 130 when the second curved portion 130 is unbent. The second curved portion 130 of the substrate 100 may include the contractible portions 140 corresponding between the display pieces 250 spaced apart from each other. When the second curved portion 130 is bent, the contractible portions 140 may contract, and the display pieces 250 may become in contact with or adjacent to each other. Further, the display unit 200 may easily have a three-dimensional curved shape at the second curved portion 130, and may display an image.

Hereinafter, a display panel according to an embodiment will be described with reference to FIGS. 3, 6, 9, 10, 11, and 12.

Figure 9:
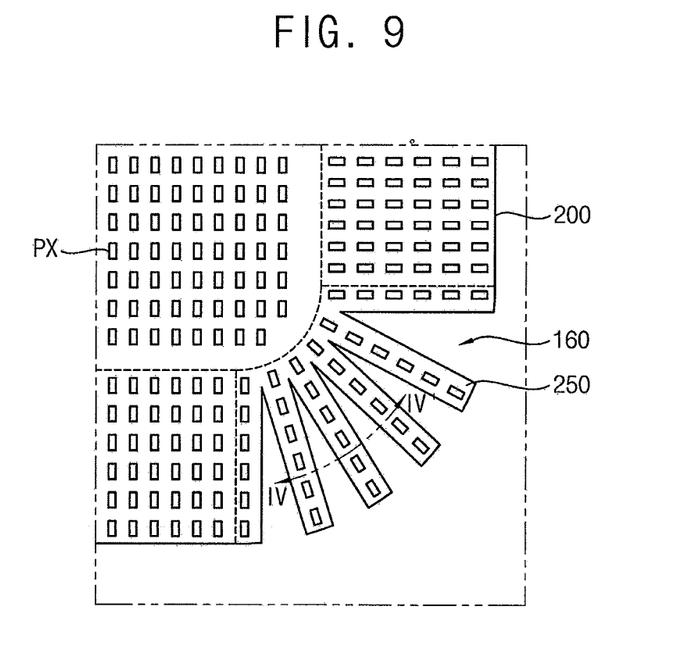
FIG. 9 illustrates a plan view of a display panel in an unbent state according to an embodiment.
Figure 10:
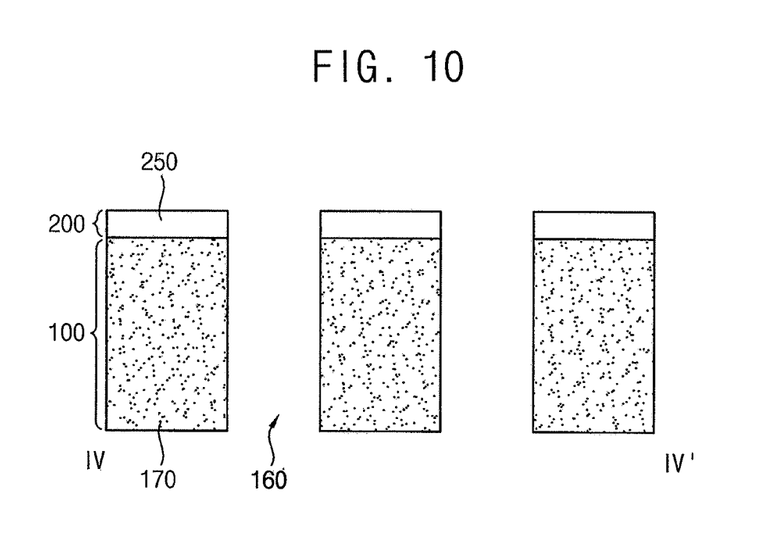
FIG. 10 illustrates a cross-sectional view of the display panel in FIG. 9.

FIG. 9 illustrates a plan view of a display panel in an unbent state according to an embodiment. FIG. 10 illustrates a cross-sectional view of the display panel in FIG. 9. FIG. 9 illustrates a plan view enlargement of an area A of the display panel in FIG. 3. FIG. 10 illustrates a cross-sectional view of the display panel illustrated in FIG. 9 taken along a line IV-IV'.

Figure 11:
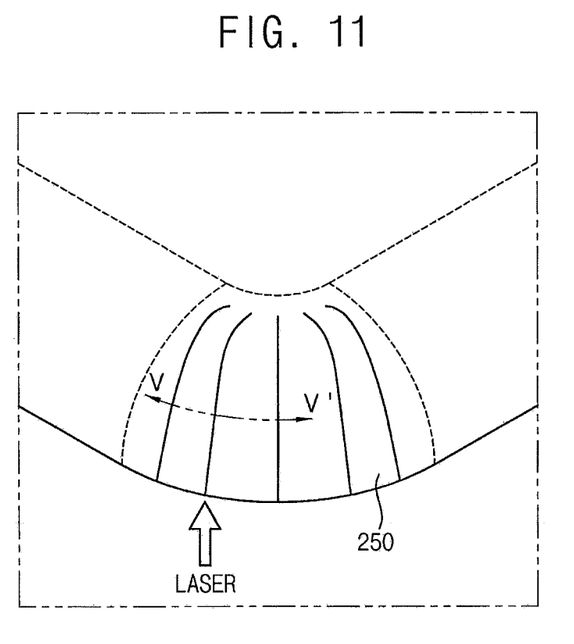
FIG. 11 illustrates a perspective view of a display panel in a bent state according to an embodiment.
Figure 12:
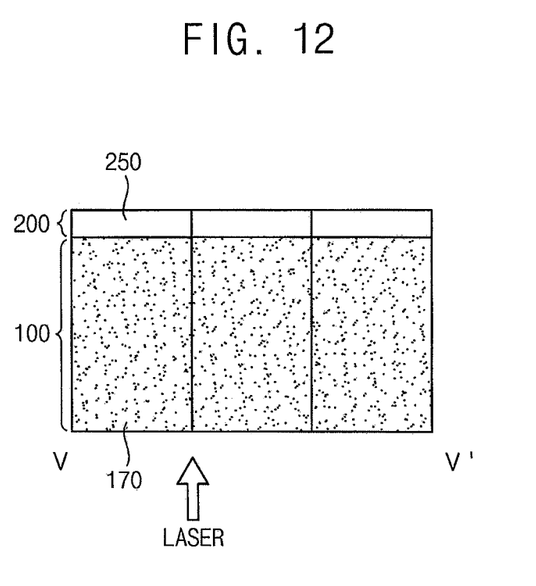
FIG. 12 illustrates a cross-sectional view of the display panel in FIG. 11.

FIG. 11 illustrates a perspective view of a display panel in a bent state according to an embodiment. FIG. 12 illustrates a cross-sectional view of the display panel in FIG. 11. FIG.

11 illustrates a plan view enlargement of an area B of the display panel illustrated in FIG. 6. FIG. 12 illustrates a cross-sectional view of the display panel illustrated in FIG. 11 taken along a line V-V'.

Referring to FIGS. 3, 6, 9, 10, 11, and 12, a display panel PN according to an embodiment may include a substrate 100 and a display unit 200. Detailed descriptions of elements of the display panel PN according to the embodiment with reference to FIGS. 3, 6, 9, 10, 11, and 12 that are substantially the same as or similar to those of the display panel PN according to an embodiment with reference to FIGS. 3, 4, 5, 6, 7, and 8, will not be repeated.

In an embodiment, the substrate 100 may include plastic having flexibility. For example, the substrate 100 may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), cellulose acetate propionate (CAP), or the like.

A second curved portion 130 of the substrate 100 may include a plurality of substrate pieces 170 and a plurality of openings 160. The substrate pieces 170 may be located at regions corresponding to a plurality of display pieces 250, and the openings 160 may be defined between the substrate pieces 170. For example, the openings 160 may be located at regions corresponding to openings between the display pieces 250. Accordingly, each of the openings 160 may have a fan shape in a plan view.

A planar area of each of the openings 160 may be calculated according to a curvature of the second curved portion 130. For example, the planar area of each of the openings 160 may be relatively small when the curvature of the second curved portion 130 is small, and the planar area of each of the openings 160 may be relatively large when the curvature of the second curved portion 130 is large.

In an embodiment, the substrate pieces 170 may be bonded to each other by an adhesive member. For example, the substrate pieces 170 may be bonded to each other upon exposure to laser light. When the second curved portion 130 is bent, sides of the substrate pieces 170 may come into contact with each other, and the substrate pieces 170 may be bonded to each other by irradiating the substrate pieces with laser light.

As described above, the second curved portion 130 of the substrate 100 may be bent as a three-dimensional curved shape. The display unit 200 may include the display pieces 250 spaced apart from each other on the second curved portion 130 when the second curved portion 130 is in an unbent state. The second curved portion 130 of the substrate 100 may include the substrate pieces 170 corresponding to the display pieces 250 spaced apart from each other and the openings 160 defined between the substrate pieces 170. When the second curved portion 130 is bent, the substrate pieces 170 may come into contact with each other, and the display pieces 250 may come into contact with each other. Further, the display unit 200 may easily have a three-dimensional curved shape at the second curved portion 130, and may display an image.

Hereinafter, a display panel according to an embodiment will be described with reference to FIGS. 3, 6, 13, 14, 15, and 16.

Figure 13:
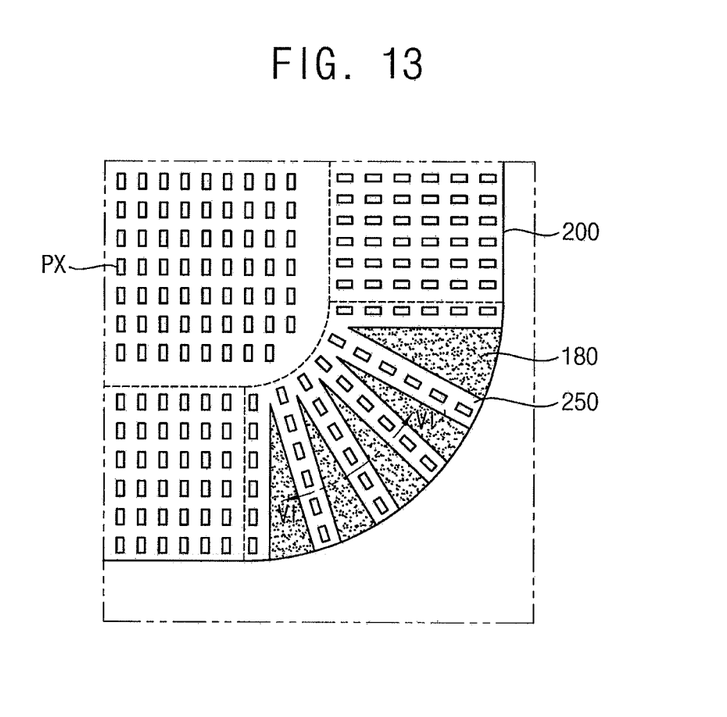
FIG. 13 illustrates a plan view of a display panel in an unbent state according to an embodiment.
Figure 14:
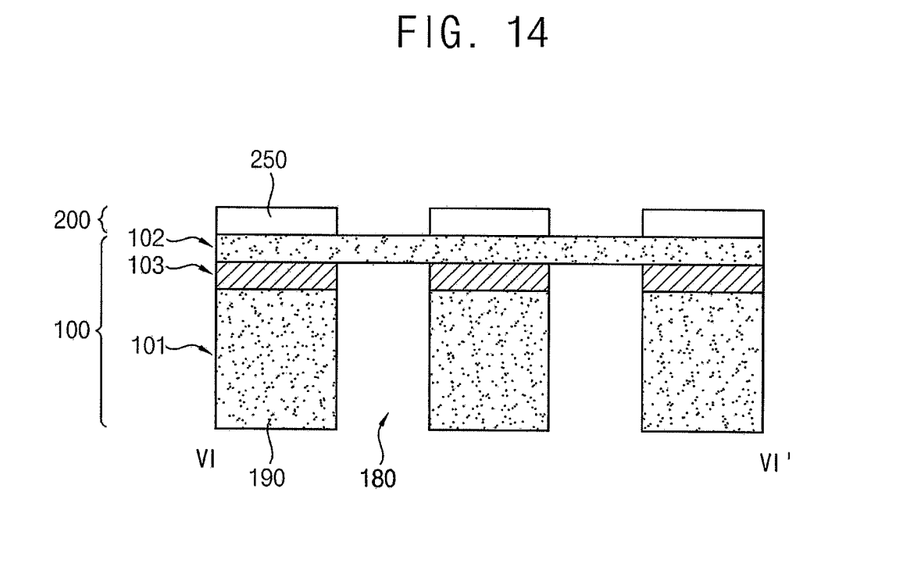
FIG. 14 illustrates a cross-sectional view of the display panel in FIG. 13.

FIG. 13 illustrates a plan view of a display panel in an unbent state according to an embodiment. FIG. 14 illustrates a cross-sectional view of the display panel illustrated in FIG. 13. FIG. 13 illustrates a plan view enlargement an area A of the display panel illustrated in FIG. 3. FIG. 14 illustrates cross-sectional view of the display panel illustrated in FIG. 13 taken along a line VI-VI'.

Figure 15:
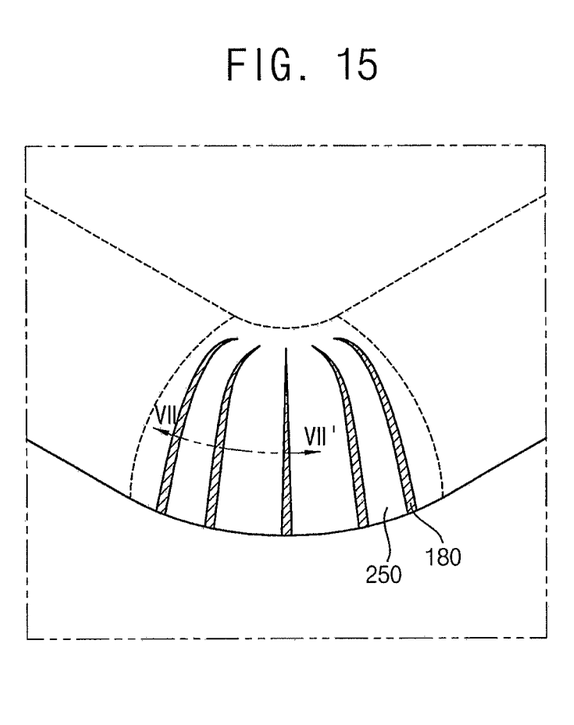
FIG. 15 illustrates a perspective view of a display panel in a bent state according an embodiment.
Figure 16:
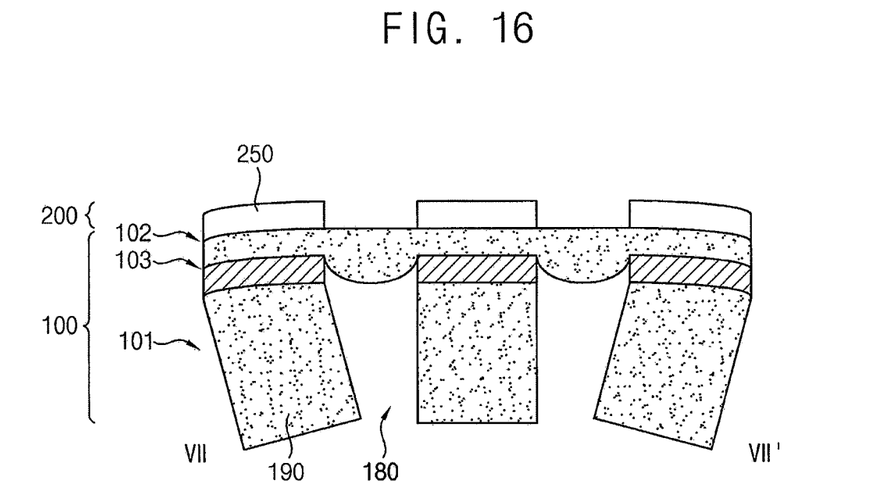
FIG. 16 illustrates a cross-sectional view of the display panel in FIG. 15.

FIG. 15 illustrates a perspective view a display panel in a bent state according to an embodiment. FIG. 16 illustrates is a cross-sectional view of the display panel illustrated in FIG. 15. FIG. 15 illustrates a plan view enlargement of an area B of the display panel illustrated in FIG. 6. FIG. 16 is a cross-sectional view of the display panel in FIG. 15 taken along a line VII-VII'.

Referring to FIGS. 3, 6, 13, 14, 15, and 16, a display panel PN according to an embodiment may include a substrate 100 and a display unit 200. Detailed descriptions on elements of the display panel PN according an embodiment with reference to FIGS. 3, 6, 13, 14, 15, and 16 that are substantially the same as or similar to those of the display panel PN according to an embodiment with reference to FIGS. 3, 6, 9, 10, 11, and 12, will not be repeated.

In an embodiment, the substrate 100 may include a first substrate layer 101, a second substrate layer 102, and a barrier layer 103. The first substrate layer 101 may include plastic having flexibility. For example, the first substrate layer 101 may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), cellulose acetate propionate (CAP), or the like.

The second substrate layer 102 may be disposed between the first substrate layer 101 and the display unit 200. The second substrate layer 102 may include plastic having flexibility. The second substrate layer 102 may be formed of material that is substantially the same as that of the first substrate layer 101. In some implementations, the first substrate layer 101 and the second substrate layer 102 may have different materials. In an embodiment, a thickness of the second substrate layer 102 may be less than a thickness of the first substrate layer 101.

The barrier layer 103 may be disposed between the first substrate layer 101 and the second substrate layer 102. The barrier layer 103 may include an inorganic material. For example, the barrier layer 103 may include materials containing silicon, such as amorphous silicon, silicon oxide, or silicon nitride. The barrier layer 103 may be formed on the first substrate layer 101, which generally may be vulnerable to oxygen and moisture. The barrier layer 103 may prevent the first substrate layer 101 from being damaged, and may prevent impurities such as oxygen and moisture from permeating inside the display device.

A second curved portion 130 of the first substrate layer 101 may include a plurality of substrate pieces 190 and a plurality of openings 180. The substrate pieces 190 may be located at regions corresponding to a plurality of display pieces 250. The openings 180 may be located at regions corresponding to spaces between the display pieces 250. For example, the openings 180 may be located at regions corresponding to openings between the display pieces 250. Accordingly, each of the openings 180 may have a fan shape in a plan view.

A planar area of each of the openings 180 may be calculated according to a curvature of the second curved portion 130. For example, the planar area of each of the openings 180 may be relatively small when the curvature of the second curved portion 130 is small, and the planar area of each of the openings 180 may be relatively large when the curvature of the second curved portion 130 is large.

When the second curved portion 130 is bent, the second substrate layer 102 may be bent, and the substrate pieces 190 may come into in contact with or may be adjacent to each other as the planar area of each of the openings 180 decreases.

As described above, the second curved portion 130 of the substrate 100 may be bent as a three-dimensional curved shape. The display pieces 250 of the display unit 200 may be spaced apart from each other on the second curved portion 130 when the second curved portion 130 is in an unbent state. The second curved portion 130 of the first substrate layer 101 may include the substrate pieces 190 corresponding to the display pieces 250 spaced apart from each other and the openings 180 corresponding between the display pieces 250. When the second curved portion 130 is bent, the substrate pieces 190 may come into contact with, or may be adjacent to, each other. The display unit 200 may easily have a three-dimensional curved shape at the second curved portion 130, and may display an image.

Hereinafter, a method of manufacturing a display device according to embodiments illustrated in FIGS. 1 to 16 will be described with reference to FIGS. 17, 18, and 19.

Figure 17:
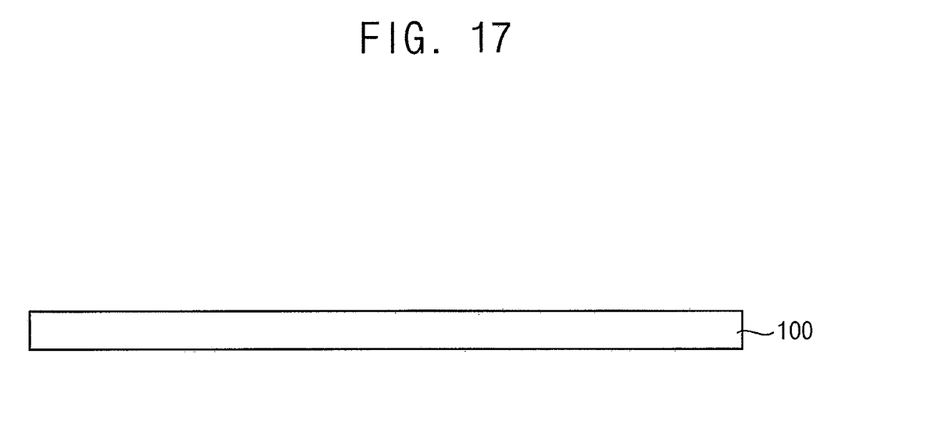
FIGS. 17, 18, and 19 illustrate cross-sectional views depicting stages of a method of manufacturing a display device according to embodiments.
Figure 18:
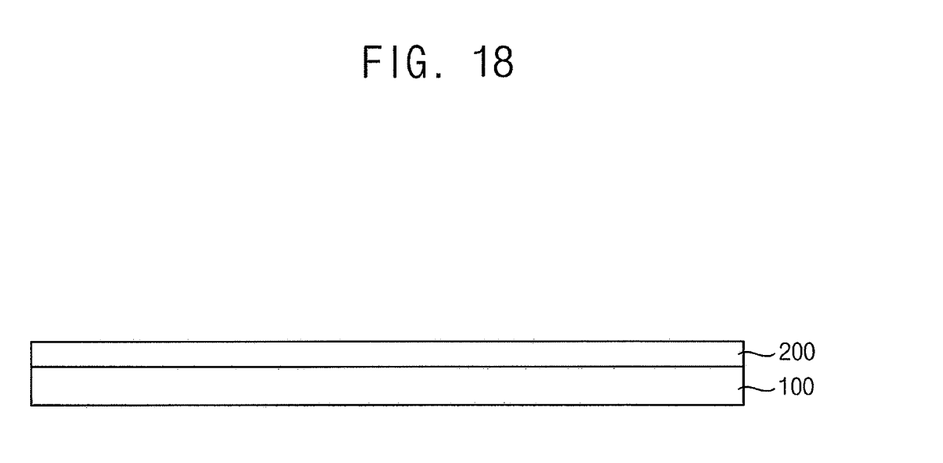
Figure 19:
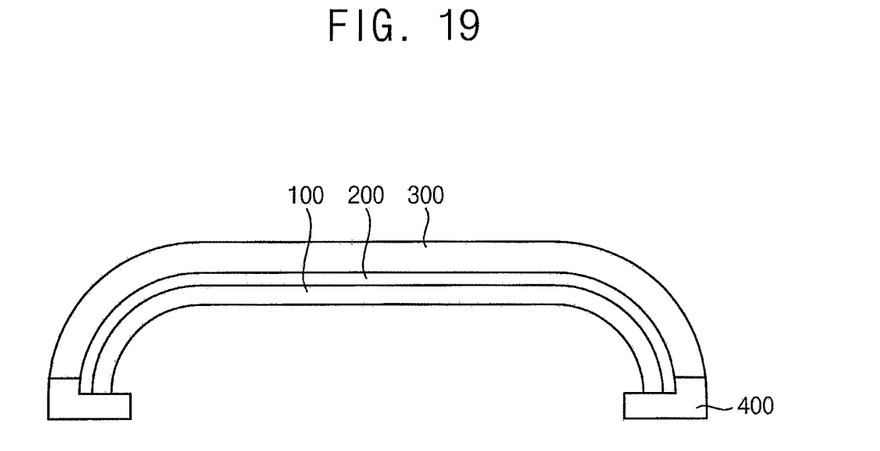

FIGS. 17, 18, and 19 illustrate cross-sectional views of a method of manufacturing a display device according to embodiments.

Referring to FIGS. 17, 18, and 19, a method of manufacturing a display device according to embodiments may include preparing a substrate 100, forming a display unit 200 on the substrate 100, and bending the substrate 100.

As illustrated in FIG. 3, the substrate 100 may include a flat portion 110, a first bendable portion 120 adjacent to a side 110a of the flat portion 110, and a second bendable portion 130 adjacent to a corner 110b of the flat portion 110 and the first bendable portion 120. Before bending the substrate 100, all of the flat portion 110, the first bendable portion 120, and the second bendable portion 130 may have a planar shape. As illustrated in FIG. 4, the display unit 200 formed on the unbent substrate 100 may include a plurality of display pieces 250 disposed on the second bendable portion 130 of the substrate 100, spaced apart from each other, and extending from the corner 110b of the flat portion 110 to an edge 130a of the second bendable portion 130. The first bendable portion 120 and the second bendable portion 130 of the substrate 100 may be bent when bending the substrate 100. Accordingly, as illustrated in FIG. 6, the flat portion 110 of the substrate 100 may maintain the planar shape, and the first bendable portion 120 and the second bendable portion 130 of the substrate 100 may have curved shapes, respectively.

Bending the substrate 100 may include combining the substrate 100 and a cover window 300, in which regions corresponding to the first bendable portion 120 and the second bendable portion 130 of the substrate 100 are bent, with the display unit 200 in between. For example, the bent cover window 300 may be disposed on a first jig, and a second jig may be disposed to face the first jig with the substrate 100, the display unit 200, and the cover window 300 in between, and then, the second jig may move toward the first jig to bend the first bendable portion 120 and the second bendable portion 130 of the substrate 100.

In a method of manufacturing the display device according to an embodiment with reference to FIGS. 3, 4, 5, 6, 7, and 8, bending the substrate 100 may include contracting a plurality of contractible portions 140 located at regions of the second bendable portion 130 of the substrate 100 corresponding between display pieces 250 of the display unit 200. In this case, the substrate 100 may include a contractible polymer, and the contractible portions 140 may be contracted by irradiating laser light onto the contractible portions 140 as illustrated in FIGS. 4, 5, 7, and 8.

In a method of manufacturing the display device according to an embodiment with reference to FIGS. 3, 6, 9, 10, 11, and 12, preparing the substrate 100 may include forming a plurality of openings 160 at regions of the second bendable portion 130 of the substrate 100 corresponding between the display pieces 250 of the display unit 200 as illustrated in FIGS. 9 and 10. Further, bending the substrate 100 may include bonding a plurality of substrate pieces 170, which are spaced apart by the openings 160, to each other. In this case, the substrate pieces 170 may be bonded to each other by irradiation of laser light as illustrated in FIGS. 11 and 12.

In a method of manufacturing the display device according to an with reference to FIGS. 3, 6, 13, 14, 15, and 16, preparing the substrate 100 may include forming a plurality of openings 180 at regions of the second bendable portion 130 of a first substrate layer 101 corresponding between the display pieces 250 of the display unit 200, as illustrated in FIGS. 13 and 14. Bending the substrate 100 may include bending a second substrate layer 102 such that substrate pieces 190 of the first substrate layer 101 come into contact with, or become adjacent to, each other as illustrated in FIGS. 15 and 16.

The display device according to the embodiments may be applied to a display device included in a computer, a notebook, a mobile phone, a smartphone, a smart pad, a PMP, a PDA, an MP3 player, or the like.

By way of summation and review, a bendable display device may include a front portion displaying an image to front thereof and a side portion extending from the front portion and displaying an image to side thereof. For example, one main image may be integrally displayed at both the front portion and the side portion. In some implementations, a main image may be displayed at the front portion, and an auxiliary image may be displayed at the side portion.

Embodiments provide a display device in which an image may be displayed at a flat portion and a curved portion located at an edge or corner of the flat portion.

Embodiments provide a method of manufacturing a display device in which an image may be displayed at a flat portion and a curved portion located at an edge or corner of the flat portion.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
   a substrate having a flat portion, a first curved portion adjacent to a side of the flat portion, and a second curved portion adjacent to a corner of the flat portion and the first curved portion; and
   a display unit on the substrate, the display unit including a plurality of display pieces on the second curved portion of the substrate, the display pieces being spaced apart from each other, and extending from the corner of the flat portion to an edge of the second curved portion.

2. The display device as claimed in claim 1, wherein the substrate includes a contractible polymer.

3. The display device as claimed in claim 1, wherein the second curved portion of the substrate includes a plurality of contractible portions located at regions corresponding to spaces between the plurality of display pieces of the display unit.

4. The display device as claimed in claim 3, wherein the plurality of contractible portions are contractible upon exposure to laser light.

5. The display device as claimed in claim 3, wherein each of the plurality of contractible portions has a fan shape in a plan view.

6. The display device as claimed in claim 3, wherein:
the second curved portion further includes a plurality of non-contractible portions at regions corresponding to the plurality of display pieces, and
a thickness of each of the plurality of contractible portions is greater than a thickness of each of the plurality of non-contractible portions.

7. The display device as claimed in claim 1, wherein the second curved portion of the substrate includes a plurality of substrate pieces at regions corresponding to the plurality of display pieces, and a plurality of openings defined between the plurality of the substrate pieces.

8. The display device as claimed in claim 7, wherein the plurality of substrate pieces are bondable to each other upon exposure to laser light.

9. The display device as claimed in claim 7, wherein each of the plurality of openings have a fan shape in a plan view.

10. The display device as claimed in claim 1, wherein:
the substrate includes a first substrate layer and a second substrate layer, the second substrate layer being between the first substrate layer and the display unit, and
the second curved portion of the first substrate layer includes a plurality of openings located at regions corresponding to spaces between the plurality of display pieces of the display unit.

11. The display device as claimed in claim 1, wherein the display unit is on the flat portion, the first curved portion, and the second curved portion of the substrate.

12. The display device as claimed in claim 1, further comprising a cover window on the display unit, wherein a portion of the cover window corresponding to the first curved portion and the second curved portion of the substrate is curved.

13. A method of manufacturing a display device, the method comprising:
preparing a substrate having a flat portion, a first bendable portion adjacent to a side of the flat portion, and a second bendable portion adjacent to a corner of the flat portion and the first bendable portion;
forming a display unit on the substrate, wherein the display unit includes a plurality of display pieces on the second bendable portion of the substrate, spaced apart from each other and extending from the corner of the flat portion to an edge of the second bendable portion; and
bending the first bendable portion and the second bendable portion of the substrate.

14. The method as claimed in claim 13, wherein the substrate includes a contractible polymer.

15. The method as claimed in claim 13, wherein:
the second bendable portion of the substrate includes a plurality of contractible portions at regions corresponding to spaces between the plurality of display pieces of the display unit, and
bending the first bendable portion and the second bendable portion includes contracting the plurality of contractible portions.

16. The method as claimed in claim 15, wherein the plurality of contractible portions are contracted by exposing the contractible portions to laser light.

17. The method as claimed in claim 13, wherein preparing the substrate includes forming a plurality of openings in the second bendable portion of the substrate, the plurality of openings corresponding to spaces between the plurality of display pieces of the display unit.

18. The method as claimed in claim 17, wherein:
the second bendable portion of the substrate includes a plurality of substrate pieces spaced apart from each other by the plurality of openings, and
bending the first bendable portion and the second bendable portion includes bonding the plurality of substrate pieces to each other.

19. The method as claimed in claim 18, wherein the plurality of substrate pieces are bonded to each other by exposing the substrate pieces to laser light.

20. The method as claimed in claim 13, wherein bending the first bendable portion and the second bendable portion includes:
combining the substrate and a cover window with the display unit in between, wherein a portion of the cover window corresponding to the first bendable portion and the second bendable portion of the substrate is curved.

* * * * *